(12) United States Patent
Becker

(10) Patent No.: US 6,542,396 B1
(45) Date of Patent: Apr. 1, 2003

(54) METHOD AND APPARATUS FOR A DENSE METAL PROGRAMMABLE ROM

(75) Inventor: Scott T. Becker, San Jose, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 09/675,574

(22) Filed: Sep. 29, 2000

(51) Int. Cl.[7] ................................................. G11C 7/00
(52) U.S. Cl. ............................. 365/94; 365/63; 365/51; 365/104
(58) Field of Search ............................ 365/63, 51, 94, 365/104

(56) References Cited

U.S. PATENT DOCUMENTS

| | | | | |
|---|---|---|---|---|
| 4,599,704 A | * | 7/1986 | Mazin | 365/109 |
| 4,888,735 A | * | 12/1989 | Lee et al. | 365/104 |
| 5,315,541 A | * | 5/1994 | Harari et al. | 365/63 |
| 5,483,483 A | * | 1/1996 | Choi et al. | 365/177 |
| 5,517,061 A | * | 5/1996 | Azmanov | 257/758 |
| 5,745,401 A | * | 4/1998 | Lee | 365/104 |
| 5,796,239 A | * | 8/1998 | van Phuoc et al. | 320/107 |

* cited by examiner

*Primary Examiner*—Viet Q. Nguyen
(74) *Attorney, Agent, or Firm*—Martine & Penilla, LLP

(57) ABSTRACT

A metal programmable ROM is disclosed that includes a memory cell array having a depth that is defined by a plurality of wordlines and a width that is defined by a plurality of bitlines. In addition, a group of memory cells are coupled between a bitline and ground, with each memory cell in the memory cell group coupled to at least one other memory cell in the memory cell group. Finally, a programmed memory cell is included that is defined by a memory cell transistor having its terminals shorted together.

7 Claims, 11 Drawing Sheets

METHOD AND APPARATUS FOR A DENSE METAL PROGRAMMABLE ROM

BACKGROUND OF THE INVENTION

1. Field of the Invention

The present invention relates generally to integrated circuits, and more particularly, to apparatuses and methods for manufacturing dense metal programmable read only memory.

2. Description of the Related Art

Semiconductor memory devices are widely used in the manufacture of digital equipment, such as microprocessor systems. To store fixed, commonly used programs, microprocessor systems generally use Read Only Memory devices or "ROMs", such as the basic input/output system (BIOS) ROM for computer systems.

Semiconductor ROMs are typically configured as an array memory cells, wherein each individual memory cell is coupled to both a wordline and a bitline. To select a particular memory cell during a read operation, memory accessing circuitry is commonly utilized. For example, memory access circuit components typically include addressing circuitry for selecting a memory cell, wordline drivers for driving a selected wordline, sense amplifiers for amplifying the signals read from the selected memory cell, and output buffers for driving data out of the memory FIG. 1 is a schematic diagram of a conventional diffusion programmable ROM cell array 10. The diffusion programmable ROM cell array 10 includes a plurality of wordlines 12, a plurality of bitlines 14, and a plurality of memory cells 16, each at the intersection of a wordline 12 and a bitline 14. It should be noted that the wordlines 12 and bitlines 14 occupy different levels of the semiconductor, and thus do not physically intersect.

In use, the wordlines 12 function as addresses for memory cells 16, while the bitlines 14 function as the output of the cell array 10. When manufacturing the diffusion programmable ROM cell array 10, each memory cell 16 is programmed to output either a logical "1" or a logical "0" when the wordline 12 addressing it is activated. Generally, a wordline 12 in a diffusion ROM is activated when it is asserted high. As described in greater detail subsequently, each memory cell 16 is programmed as a "1" cell or a "0" cell during manufacturing, depending on the desired functionality of the ROM.

During a memory read operation, the ROM receives a memory address of a desired memory location within the memory cell array 10 from an address bus. The memory address, or a portion thereof, is then forwarded to an address decoder, which decodes the address and asserts one of the wordlines 12 in the memory cell array 10 high, 20 thus activating it, all other wordlines 12 remain low. Thereafter, depending on the programming of the ROM, each bitline 14 will output either a logical "1" or "0." In effect, by programming the various memory cell locations of the ROM, each wordline 12 can be used to select a particular binary output combination from the bitlines 14.

FIG. 2 is a schematic diagram showing a magnified view of a conventional diffusion programmable ROM cell array 18. The conventional diffusion programmable ROM cell array 18 includes wordlines 12a and 12b, bitlines 14a and 14b, and memory ell transistors 16a–16d.

As shown in FIG. 2, each memory cell of the diffusion programmable ROM memory cell array is actually a transistor 16a–16d. Further, the gate of each memory cell transistor 16a–16d is coupled to a wordline 12a/12b, and a first terminal of each memory cell transistor 16a–16d is coupled to a bitline 14a/14b. Finally, a second terminal of each memory cell transistor 16a–16d is coupled to ground.

Initially, a precharge circuit is used to charge each bitline 14a/14b high, such that a logic "1" is read out from each memory cell. Thereafter, depending on the programming of the memory cell array, each bitline 14a/14b will either remain high or be drawn low when a particular wordline 12a/12b is activated.

For example, memory cell transistor 16a functions such that when wordline 12a is low, memory cell transistor 16a is shut off, and therefore bitline 14a maintains its state, generally high. However, when wordline 12a is asserted high, memory cell transistor 16a turns on, allowing the bitline 14a to be drawn to ground, thus pulling the bitline 14a low. Since memory cell transistor 16a allows the bitline 14a to be drawn low, it is called a "0" cell.

For a memory cell to allow the bitline to remain high when the wordline 12 is asserted, it must be programmed as a "1" cell. In a diffusion programmable ROM, the memory cell transistor 16a–16d is simply disabled to create a "1" cell. For example, memory cell transistor 16d has been disabled, illustrated by its non-connection to the bitline 14b. Thus, regardless of the state of the wordline 12b, the memory cell transistor 16d will not pull the bitline 14b low, and therefore the bitline 14b will maintain its state, which is generally high.

FIG. 3A is an illustration showing a conventional diffusion programmable ROM memory cell 16a, programmed as a "0" cell. The "0" cell 16a includes a wordline 12 coupled to a diffusion layer 20, a bitline contact 22 coupling the diffusion layer 20 to a bitline 14, and a ground diffusion wire 24 that is coupled to ground.

As stated previously, initially the bitline 14 is charged high to a logical "1." While the wordline 12 is low, the bitline 14 remains high because the diffusion layer 20 isolates the bitline contact 22 from the ground diffusion wire 24. However, when the wordline 12 is asserted high, the bitline 14 is pulled low because the diffusion layer 20 becomes conductive when the wordline 12 is high. Specifically, asserting the wordline 12 high charges the diffusion layer 20 and causes it to conduct, creating a connection between the bitline contact 22 and the ground diffusion wire 24. Since the bitline 14 is coupled to the bitline contact 22, and thus to the ground diffusion wire 24 via the diffusion layer 20, the bitline 14 is pulled low.

FIG. 3B is an illustration showing a conventional diffusion programmable ROM memory cell 16d, programmed as a "1" cell. The "1" memory cell 16d includes a wordline 12, a diffusion layer 20 separated into a first portion 26a and a second portion 26b, a bitline contact 22 coupling the first portion 26a of the diffusion layer 20 to a bitline 14, and a ground diffusion wire 24 coupling the second portion 26b of the diffusion layer 20 to ground.

Similar to the "0" cell, the "1" memory cell 16d initially has the bitline 14 charged high to a logical "1." While the wordline 12 is low, the bitline 14 remains high because the diffusion layer 20 isolates the bitline contact 22 from the ground diffusion wire 24. However, unlike the "0" cell, the "1" cell allows the bitline 14 to remain high when the wordline 12 is asserted high. Specifically, since the diffusion layer 20 is removed from around the wordline 12, the diffusion layer 20 is not charged when the wordline 12 is asserted high, and thus, a connection is not formed between the bitline contact 22 and the ground diffusion wire 24. Hence, the bitline 14 is never pulled low in the "1" memory cell 16b.

FIG. 4 is an illustration showing a conventional diffusion programmable ROM cell array 30 configuration, comprising two memory cells. The conventional diffusion programmable ROM cell array 30 includes a first memory cell 32 and a second memory cell 34. The first memory cell 32 includes a first wordline 12a coupled to a diffusion layer 20, a shared bitline contact 22 coupling a bitline 14 to the diffusion layer 20, and a first ground diffusion wire 24a coupling the diffusion layer 20 to ground.

The second memory cell 34 shares the diffusion layer 20 with the first memory cell 32, and includes a second wordline 12b coupled to the diffusion layer 20. The second memory cell 34 also includes the shared bitline contact 22, which couples the bitline 14 to the diffusion layer 20, and a second ground diffusion wire 24b coupling the diffusion layer 20 to ground.

In operation, the first wordline 12a is utilized to address the first memory cell 32, and the second wordline 12b is utilized to address the second memory cell 34, both of which can affect the bitline 14.

For the first memory cell 32, the bitline 14 is initially charged high to a logical "1." While the first wordline 12a is low, the bitline 14 maintains its state, usually high, because the diffusion layer 20 isolates the shared bitline contact 22 from the first ground diffusion wire 24a. However, when the first wordline 12a is asserted high, the bitline 14 is pulled low because the diffusion layer 20 becomes conductive between the shared bitline contact 22 and the first ground diffusion wire 24a.

Specifically, asserting the first wordline 12a high charges the diffusion layer 20 between the shared bitline contact 22 and the first ground diffusion wire 24a and causes it to conduct, thus creating a connection between the shared bitline contact 22 and the first ground diffusion wire 24a. Since the bitline 14 is coupled to the shared bitline contact 22, and therefore also to the first ground diffusion wire 24a via the diffusion layer 20, the bitline 14 is pulled low.

The second memory cell 34 operates in a similar manner. Specifically, asserting the second wordline 12b high charges the diffusion layer 20 between the shared bitline contact 22 and the second ground diffusion wire 24b and causes it to conduct, thus creating a connection between the shared bitline contact 22 and the second ground diffusion wire 24b. Since the bitline 14 is coupled to the shared bitline contact 22, and therefore also to the second ground diffusion wire 24b via the charged diffusion layer 20, the bitline 14 is pulled low.

Today's semiconductor processes are complicated requiring dozens of steps, each taking up time and introducing materials handling and inventor factors. Further, customers require the turnaround time or cycle time to be kept as short as possible. However, since the code for data and programs stored in the ROM are fixed at the time of manufacture, a mistake in the ROM code results in wasted ROM wafers. For example, if the ROM includes program code, and a bug is later discovered in the program code, wafers containing ROMs are wasted if the wafers have already proceeded past the processing step required for programming the ROMs.

For this reason, programming should be done as late in the manufacturing process as possible. However, since the diffusion layer must be formed early in the manufacturing process, a diffusion programmable ROM must be programmed early in the manufacturing process. In response to this shortcoming, metal or via programmable ROMs were developed that allow late process programming.

FIG. 5 is an illustration showing a conventional via programmable ROM cell array 40 configuration, comprising two memory cells. The via programmable ROM cell array 40 includes a first memory cell 42 and a second memory cell 44. The first memory cell 42 includes a first diffusion layer 20a coupled to a first wordline 12a, a first ground diffusion wire 24a, a first metal to diffusion contact 22a which couples a first m1 pad 46a to the drain diffusion 20a of the first memory cell 42, and a first m2 to m1 via 22b which couples the first m1 pad 46a to the m2 bitline14. Similarly, the second memory cell 44 includes a second diffusion layer 20b coupled to a second wordline 12b, a second ground diffusion wire 24b, a second diffusion contact 22c, a second m1 pad 46b, and a second m2 to m1 via 22d which couples to the bitline 14.

The via-programmable ROM cell array 40 operates similar to the diffusion programmable ROM cell array discussed previously. Specifically, in the first memory cell 42, when the first wordline 12a is low, the first diffusion layer 20a is nonconductive, and therefore current cannot be conducted through the first m2 to m1 via 22b to the first m1 pad 46a down through the first metal to diffusion contact 22a to the ground diffusion wire 24a. When the first wordline 12a is asserted high, the first diffusion layer 20a becomes charged and therefore conductive, thus forming a conduction path between the first metal to diffusion contact 22a and the first m1 pad 46a and the first m2 to m1 via 22b and the diffusion ground wire 24a. Since the bitline 14 is coupled to first m2 to m1 via 22b via the first m1 pad 46a and the first metal to diffusion contact 22a, the bitline 14 goes low, resulting in a logical "0." The second memory cell 44 operates in a similar manner.

Both the first and second memory cells 42 and 44 are "0" cells because they allow the bitline 14 to go low when their corresponding wordline 12a/12b is selected. To make a via programmable ROM memory cell a "1" cell, the bitline m2 to m1 via is removed. For example, removing the first bitline m2 to m1 via 22b will program the first memory cell 42 to a "1" cell.

Since the memory cells in a metal programmable ROM are programmed by altering a via layer rather than the diffusion layer, a via programmable ROM can be programmed later in the manufacturing process, when the via layers are formed. In this manner, production can be initiated on a wafer of via programmable ROMs, and held at a later stage in the manufacturing process. Micro-code for the ROMs can be upgraded with a minimal amount of time used to finish the wafers. Thus, via programmable ROMs provide greater flexibility than diffusion programmable ROMs.

However, as shown in FIG. 5, the bitline contacts 22a/22c, m1 pads 46a/46b, and m2 to m1 vias 22b/22d cannot be shared in the via programmable ROM memory cell array 40. Hence, each memory cell 42/44 must be formed on a separate portion of diffusion, resulting in wasted space 50. More particularly, the space 50 between the first m1 pad 46a and the second m1 pad 46b is wasted. Thus, conventional via programmable ROMs are less dense, and consequently larger, than conventional diffusion programmable ROMs.

As a result, semiconductor chip designers conventionally had to choose between the flexibility provided by metal programmable ROMs, and the density provided by diffusion programmable ROMs.

Further, there exist minimum size rules that restrict the minimum size of a piece of diffusion used in semiconductor manufacturing to a predetermined minimum diffusion size, as a result of manufacturing limitations of other semiconductor manufacturing processes. Thus, a transistor designed on a very small portion of diffusion will be restricted to using a larger diffusion size if the particular designed size of diffusion is smaller than the predetermined minimum diffusion size.

Thus, each "1" cell of a conventional diffusion programmable ROM requires two separate portions of diffusion, each being no smaller than the predetermined minimum diffusion size. Similarly, all memory cells of a conventional via programmable ROM are formed on separate portions of diffusion, each being no smaller than the predetermined minimum diffusion size. Thus, there is a minimum size to which conventional programmable ROMs may be designed.

In view of the forgoing, there is a need for improved methods for manufacturing a programmable ROM. The method provide the manufacturing flexibility of a via/metal programmable ROM, while providing the density of a diffusion programmable ROM.

SUMMARY OF THE INVENTION

Broadly speaking, the present invention fills these needs by providing a dense metal programmable ROM using a NAND/NOR architecture. In one embodiment, a metal programmable ROM is disclosed. The metal programmable ROM includes a memory cell array having a depth that is defined by a plurality of wordlines and a width that is defined by a plurality of bitlines. In addition, a group of memory cells are coupled between a bitline and ground, with each memory cell in the memory cell group coupled to at least one other memory cell in the memory cell group. Finally, a programmed memory cell is included that is defined by a memory cell transistor having its terminals shorted together.

In another embodiment, the metal programmable ROM includes a memory cell array having a depth defined by a plurality of wordlines and a width defined by a plurality of bitlines, as in the first embodiment, and a group of transistors coupled to a subset of the wordlines. The group of transistors includes a first transistor having a first terminal coupled to a bitline, and a gate terminal coupled to one of the wordlines in the subset of wordlines. The group of transistors also includes a second transistor having a second terminal coupled to ground, and a second gate terminal coupled to another wordline of the subset of wordlines.

A method for manufacturing a metal programmable ROM is disclosed in yet a further embodiment. Initially, a group of memory cells are formed, with each memory cell connected to a corresponding wordline of the metal programmable ROM. Each of the memory cells in the memory cell group is then interconnected between a single bitline connection and the ground. Further, the memory cells are programmed by shorting a transistor associated with the programmed memory cell.

Configuring memory cell groups of the memory array in a NAND type arrangement allows the memory cells of the memory cell group to share one bitline contact. Advantageously, the contact sharing configuration of the present invention reduces the bitline load and allows for a denser cell array.

Further, groups of memory cells of the present invention are formed on a single portion of diffusion, and more than one memory cell group may occupy the single portion of diffusion. Thus, there are generally no concerns about minimum diffusion size. As a result, both "1" cell and "0" cell memory transistors may be made smaller than is possible with conventional via/metal programmable ROMs. Consequently, the dense metal programmable ROM of the present invention can be made smaller and denser than conventional via/metal programmable ROMs.

Moreover, the metal programmable ROM of the present invention is programmed at the metal layer, rather than the diffusion level. As a result, the present invention provides increased flexibility because the metal programmable ROM wafers may be held at the metal level, thus allowing for quicker production parts after a design code change.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

The present invention provides method for designing a metal programmable ROM based on a NAND/NOR architecture. Advantageously, the metal programmable ROM of the present invention provides the programming flexibility of metal programmable ROMs, while preserving the high density provided by diffusion programmable ROMs. In the following description, numerous specific details are set forth in order to provide a thorough understanding of the present invention. It will be apparent, however, to one skilled in the art that the present invention may be practiced without some or all of these details. In other instances, well known process steps have not been described in detail in order not to unnecessarily obscure the present invention.

Figure 1:
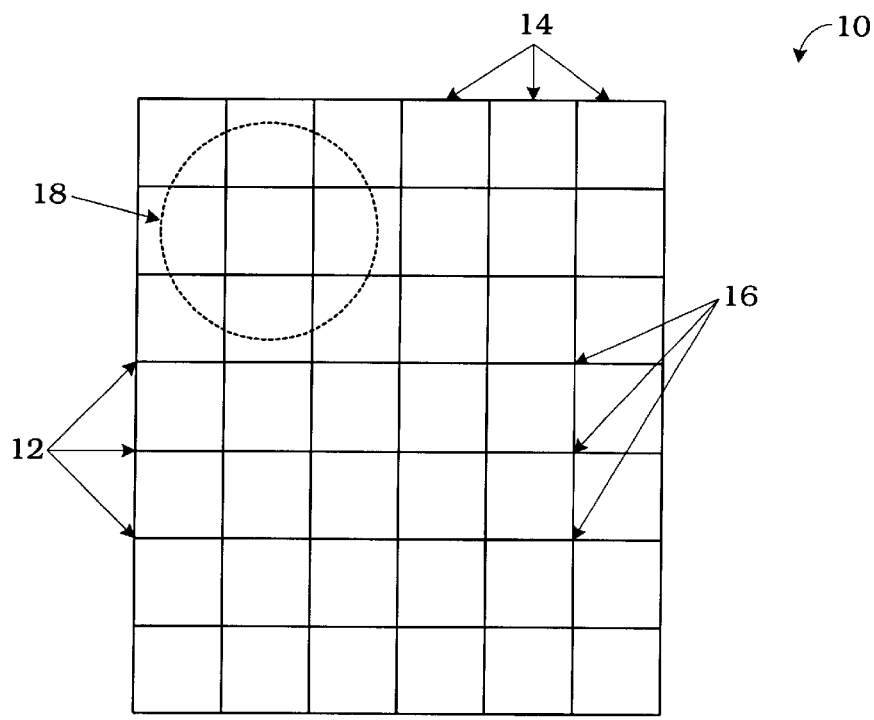
FIG. 1 is a schematic diagram of a conventional diffusion programmable ROM memory cell array.
Figure 2:
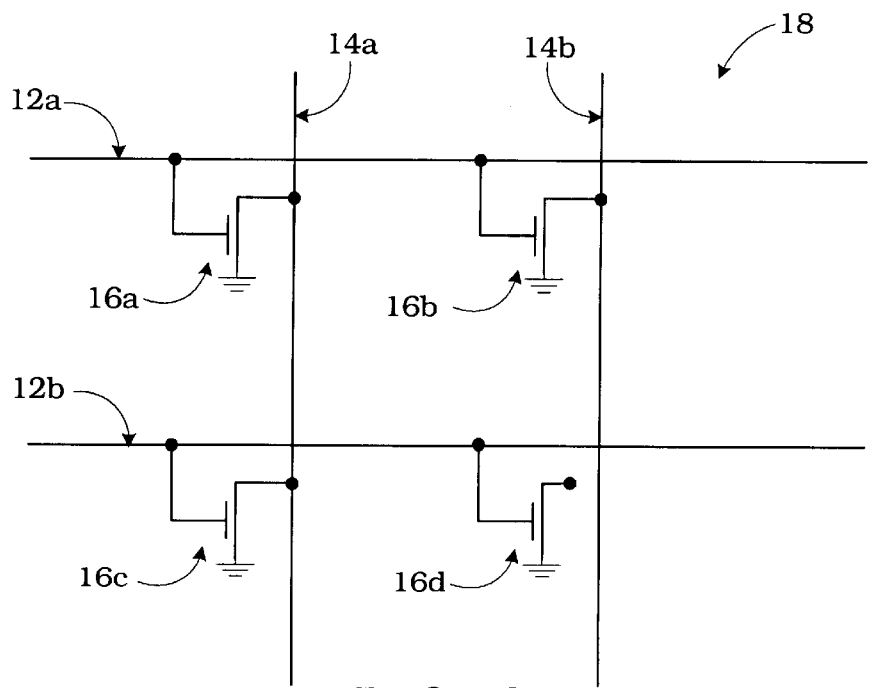
FIG. 2 is a schematic diagram showing a magnified view of a conventional diffusion programmable ROM memory cell array.
Figure 3A:
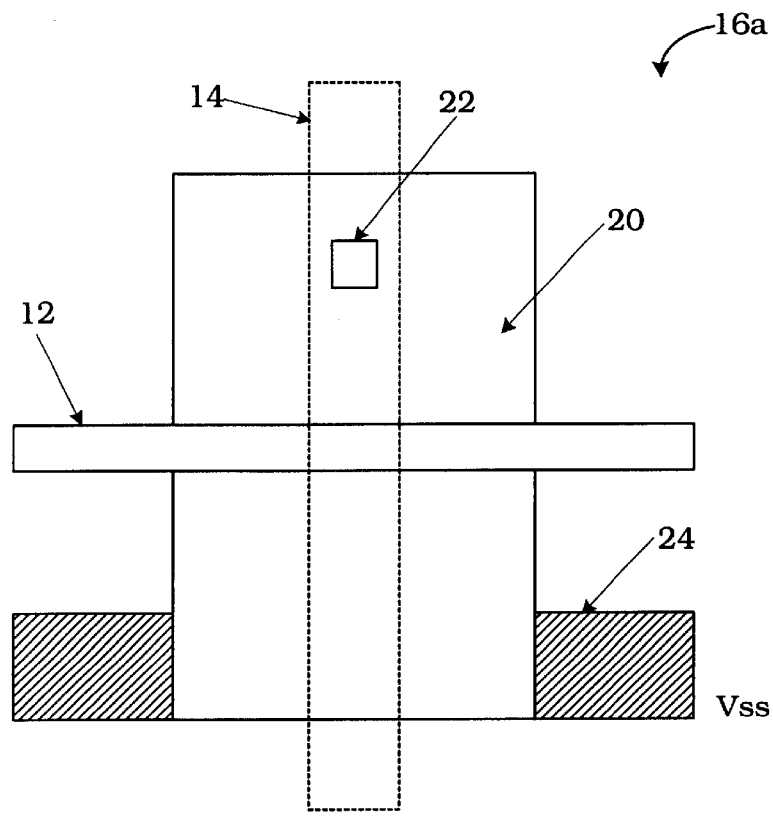
FIG. 3A is an illustration showing a conventional diffusion programmable ROM memory cell, programmed as a "0" cell.
Figure 3B:
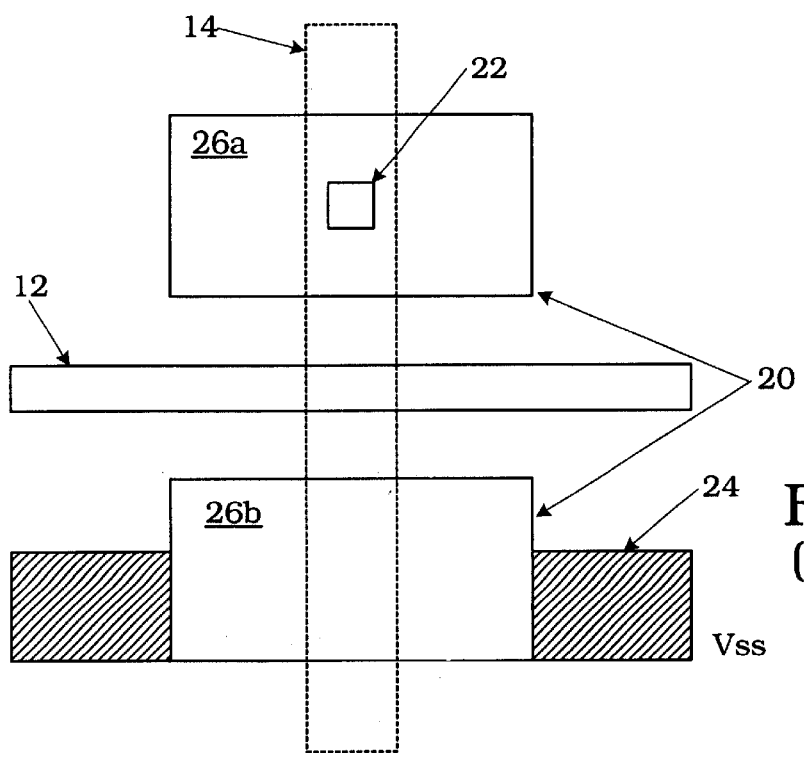
FIG. 3B is an illustration showing a conventional diffusion programmable ROM memory cell, programmed as a "1" cell.
Figure 4:
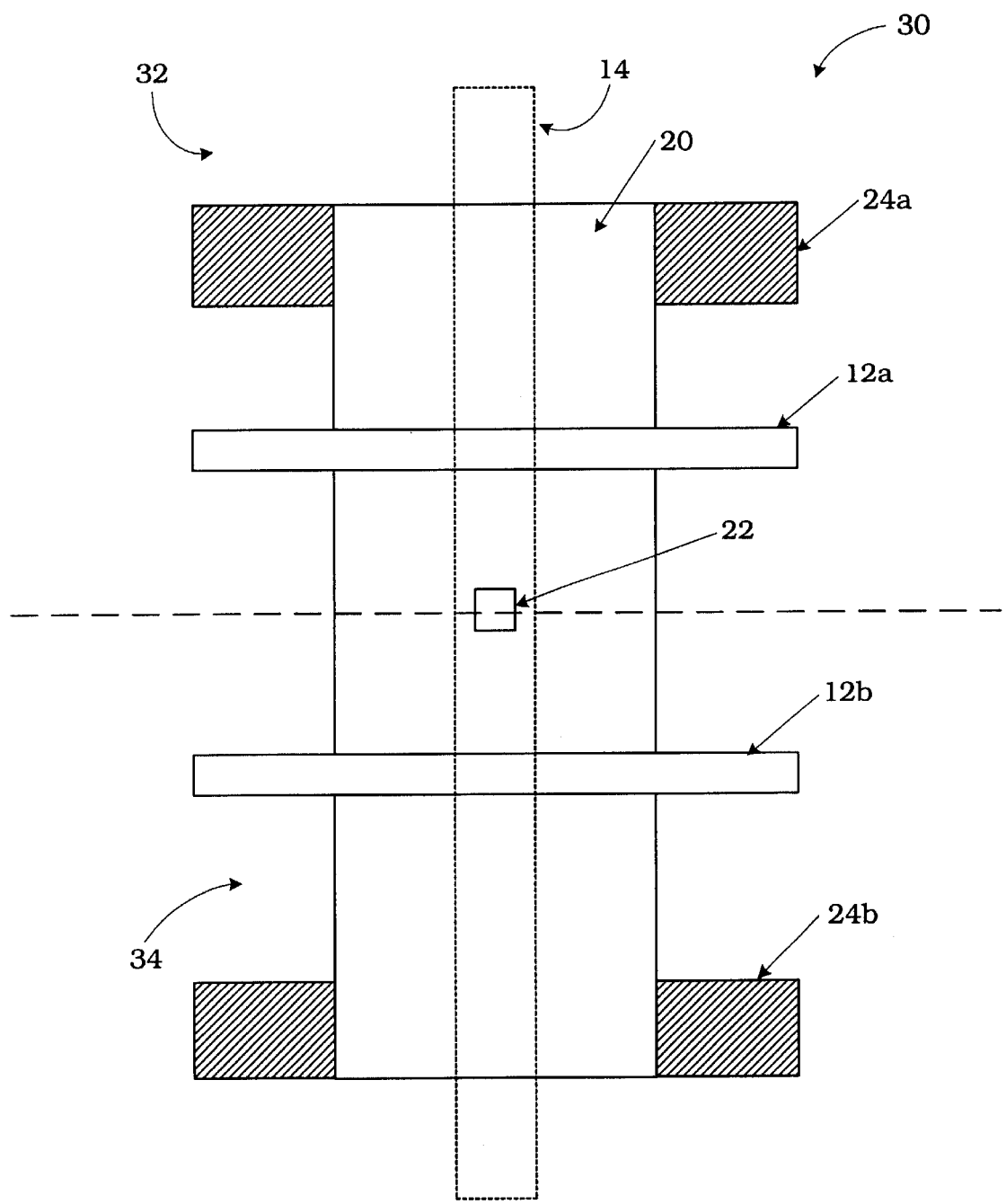
FIG. 4 is an illustration showing a conventional diffusion programmable ROM memory cell array configuration comprising two memory cells.
Figure 5:
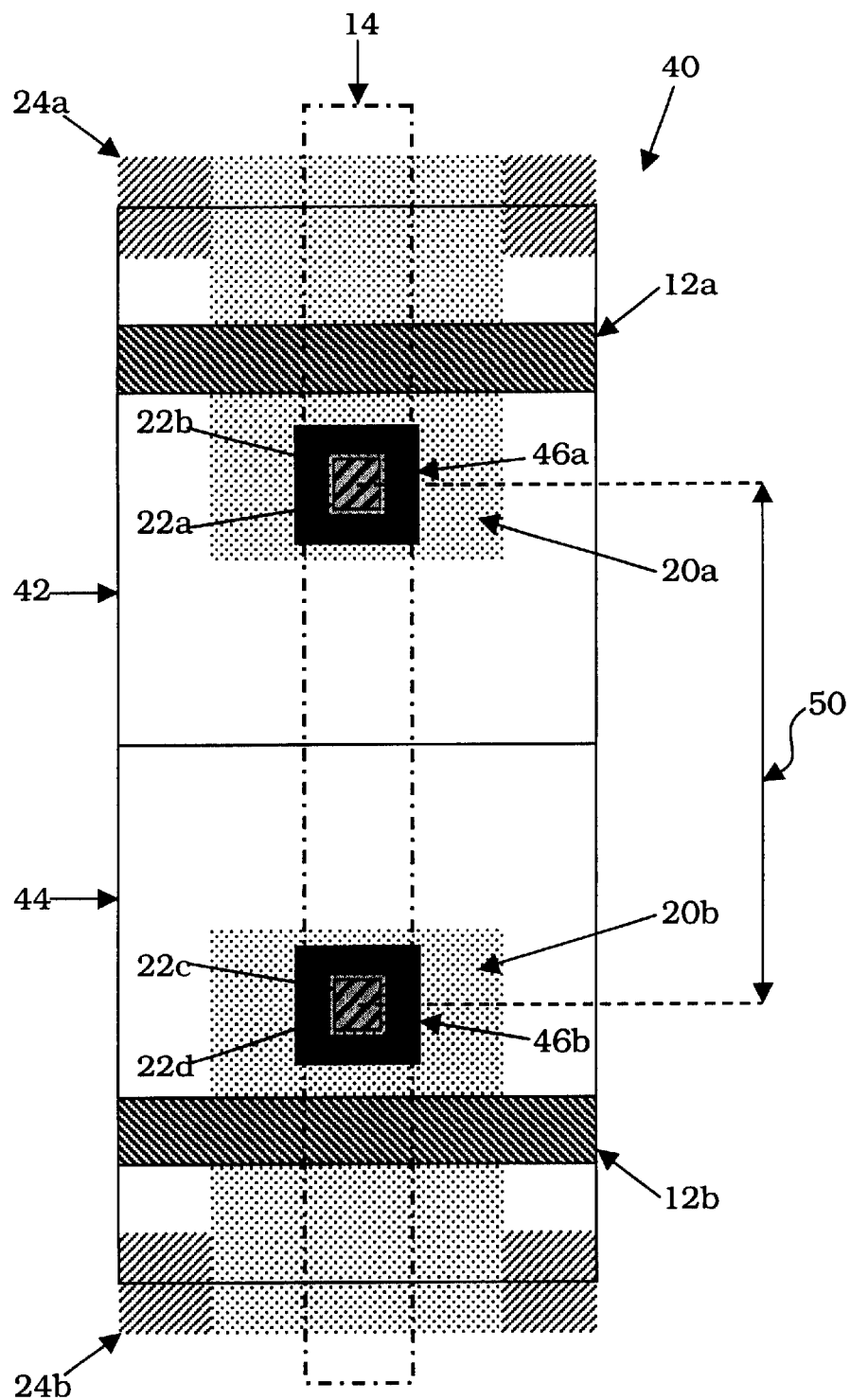
FIG. 5 is an illustration showing a conventional via programmable ROM memory cell array configuration comprising two memory cells.
Figure 6:
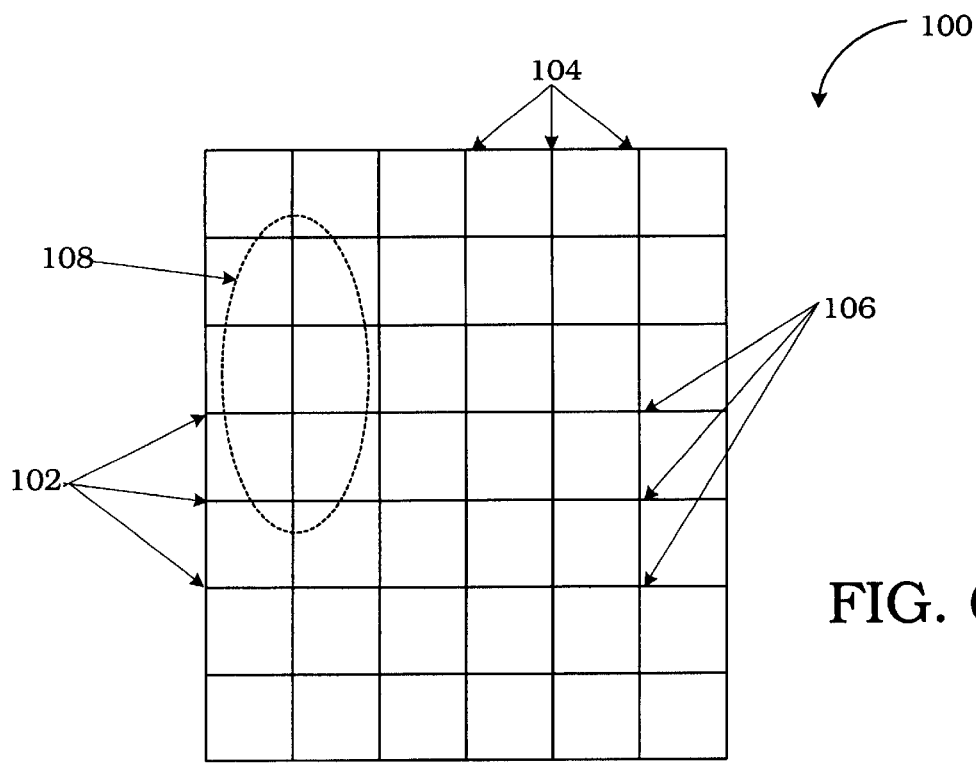
FIG. 6 is a schematic diagram of a metal programmable ROM memory cell array, in accordance with an embodiment of the present invention.

FIGS. 1–5 have been described in terms of the prior art. FIG. 6 is a schematic diagram of a metal programmable ROM memory cell array 100, in accordance with an embodiment of the present invention. The metal programmable ROM memory cell array 100 includes a plurality of wordlines 102, a plurality of bitlines 104, and a plurality of memory cells 106, each at the intersection of a wordline 102 and a bitline 104. It should be noted that the wordlines 102 and bitlines 104 occupy different levels of the semiconductor, and thus do not physically intersect.

In use, the wordlines 102 function as addresses for the memory cells 106, while the bitlines 104 function as the output of the memory cell array 100. When manufacturing the metal programmable ROM memory cell array 100, the memory cells 106 are programmed to output either a logical "1" or a logical "0" on a corresponding bitline 104, depending on which wordline 102 is selected. As described in greater detail subsequently, each memory cell 106 is programmed as either a "1" cell or a "0" cell during manufacturing process, depending on the desired functionality of the ROM.

During a memory read operation, the metal programmable ROM receives a memory address of a desired memory location within the memory cell array 100 from an address bus. The entire memory address, or a portion thereof, is then forwarded to an address decoder, which decodes the address and selects one of the wordlines 102. Thereafter, depending on the programming of the metal programmable ROM, each bitline 104 will output either a logical "1" or a logical "0." By programming the various memory cell locations 106, each wordline 102 can be used to select a particular binary output combination of the bitlines 104.

Figure 7:
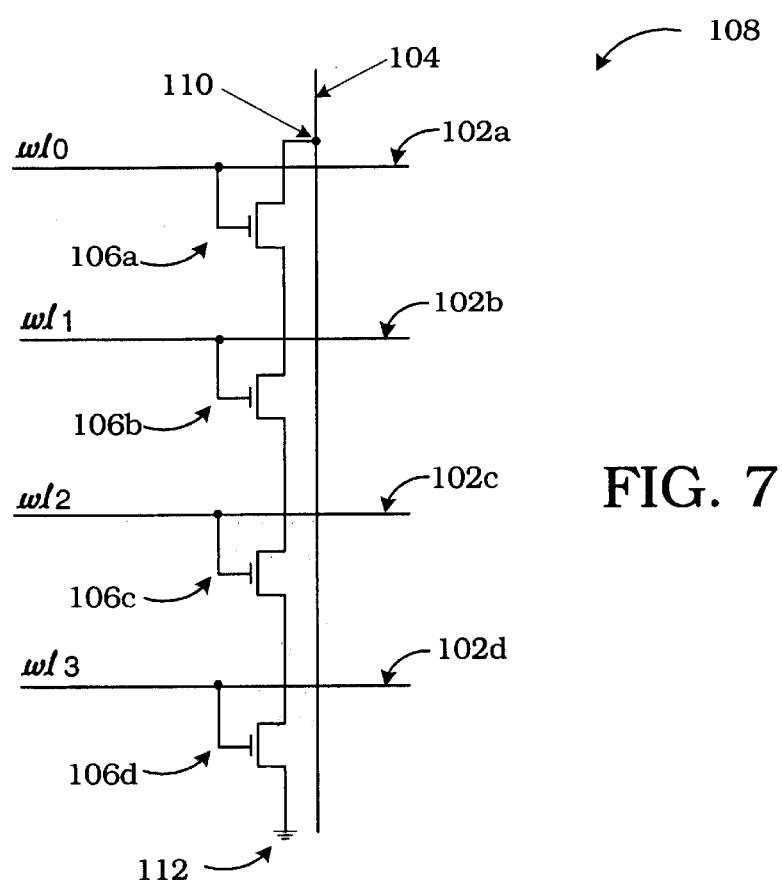
FIG. 7 is a schematic diagram showing a memory cell group of a metal programmable ROM memory cell array, in accordance with an embodiment of the present invention.

FIG. 7 is a schematic diagram showing a memory cell group 108 of a metal programmable ROM cell array, in accordance with an embodiment of the present invention. The memory cell group 108 includes a bitline 104, and a plurality of wordlines 102a–102d, each coupled to a gate terminal of a memory cell transistor 106a–106d, each having a gate, a first terminal, and a second terminal. As with FIG. 6, the wordlines 102a–102d and the bitline 104 occupy different levels of the semiconductor, and thus do not physically intersect.

As shown in FIG. 7, a first terminal of transistor 106a is coupled to the bitline 104 via bitline contact 110, the second terminal of transistor 106a is coupled to a first terminal of transistor 106b, and the gate of transistor 106a is coupled to wordline 102a. The second terminal of transistor 106b is coupled to a first terminal of transistor 106c, and the gate of transistor 106b is coupled to wordline 102b. Further, the second terminal of transistor 106c is coupled to a first terminal of transistor 106d, while the gate of transistor 106c is coupled to wordline 102c. Finally, the second terminal of transistor 106d is coupled to a virtual ground 112, while the gate of transistor 106d is coupled to wordline 102d.

For each memory cell transistor 106a–106d, when the corresponding wordline 102a–102d coupled to its gate is asserted high, the transistor conducts, allowing current to flow from its first terminal to its second terminal. When the corresponding wordline 102a–102d coupled to its gate is pulled low, the transistor turns off, thus preventing current flowing from its first terminal to its second terminal.

With this in mind, it can be seen that current will flow from the bitline 104 through the bitline contact 110 to the virtual ground 112 only when all the transistors 106a–106d are on. Hence, all the wordlines 102a–102d coupled to the memory cell group 108 must be asserted high for the bitline 104 to be pulled low since all the memory cell transistors 106a–106d are on only when all the corresponding wordlines 102a–102d are high. Therefore, the memory cell group 108 functions similar to a four-input NAND gate, where the wordlines 102a–102d are the inputs and the bitline 104 is the output. Advantageously, configuring the memory cell group 108 of the metal programmable ROM array in a NAND gate type arrangement allows the memory cell group 108 to share the bitline contact 110 and the virtual ground 112, discussed in greater detail next with reference to FIG. 8.

Figure 8:
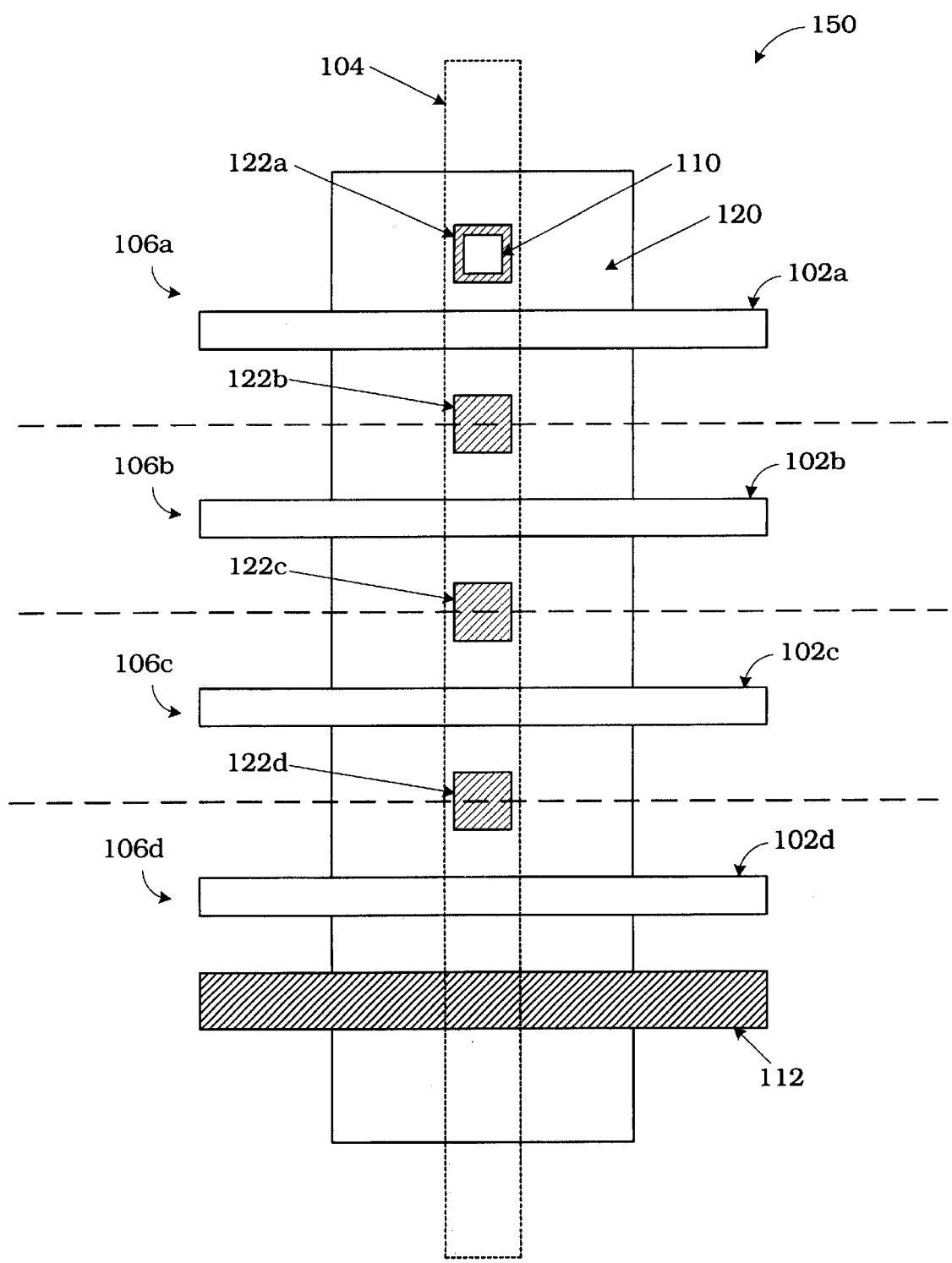
FIG. 8 is an illustration showing an exemplary memory cell group of a metal programmable ROM memory cell array, in accordance with an embodiment of the present invention.

FIG. 8 is an illustration showing an exemplary memory cell group 150 of a metal programmable memory cell array, in accordance with an embodiment of the present invention. The memory cell group 150 includes a bitline 104, a plurality of polysilicon wordlines 102a–102d coupled to a diffusion layer 120, a plurality of metal pads 122a–122d also coupled to the diffusion layer 120, and a bitline contact 110 coupling the bitline 104 to the first metal pad 122a. In addition, the memory cell group 150 includes a group virtual ground 112 coupled to the diffusion layer 120. It will be noted that the polysilicon wordlines 102a–102d, the metal pads 122a–122d, and the bitline 104 are all formed on different levels of the substrate, and therefore do not physically interact except through contact vias, such as the bitline contact 110.

Formed on corresponding gate oxide lines, the polysilicon wordlines 102a–102d combined with the diffusion layer 120 to form memory cell transistors 106a–106d. The metal pads 122a–122d function as connections between the terminals of the memory cell transistors 106a–106d for programming purposes, discussed in greater detail later. Further, the first metal pad 122a forms connection between a first terminal of the first memory cell transistor 106a and the bitline 104 via the bitline contact 110. Finally, the second terminal of memory cell transistor 106d is coupled to the group virtual ground 112. It will be noted that although only four memory cell transistors are shown in the memory cell group 150 of FIG. 8, any number of memory cell transistors may be included in a single memory cell group as desired by the ROM designer.

As described in greater detail subsequently, each memory cell group 150 is associated with a group virtual ground 112. The group virtual ground 112 is an addressable ground that may be individually enabled. In this manner, when a memory cell of a particular memory cell group is addressed, the associated group virtual ground 112 is enabled. All other group virtual grounds in the metal programmable memory cell array are then disabled.

The wordlines 102a–102d coupled to the memory cell group 150 form the gates of transistors 106a–106d. Thus, when a wordline 102a–102d is asserted high, the corresponding memory cell transistor 106a–106d conducts, allowing current to flow from its first terminal to its second terminal. When a wordline 102a–102d is pulled low, the corresponding memory cell transistor 106a–106d turns off, thus preventing current flowing between its terminals.

Thus, current will flow from the bitline 104 through the bitline contact 110 and metal pad 122a to the group virtual ground 112 only when all the memory cell transistors 106a–106d are on. Hence, all the wordlines 102a–102d coupled to the memory cell group 150 must be asserted high for the bitline 104 to be pulled low because all the memory cell transistors 106a–106d are on only when all the wordlines 102a–102d, which form the memory cell transistor gates, are asserted high.

As stated previously, the memory cell group 150 functions similar to a four-input NAND gate, where the wordlines 102a–102d are the inputs and the bitline 104 is the output. Advantageously, configuring the memory cell group 150 of the metal programmable ROM array in a NAND gate type arrangement allows the memory cell group 150 to share one bitline contact 110. This contact sharing configuration of the present invention reduces the bitline load and allows for a denser cell array, as discussed in greater detail subsequently.

In operation, the present invention uses an address decoder to decode a received memory address into a wordline selection. However, unlike conventional ROMs, the present invention does not assert the selected wordline high.

In the present invention, wordlines forming the memory cell transistors 106a–106d of a memory cell group 150 form a wordline subset of all the wordlines in the metal programmable ROM cell array. When a particular wordline is selected in the present invention, the selected wordline is pulled low, while all non-selected wordlines in the same wordline subset as the selected wordline are asserted high. Further, all wordlines outside the wordline subset of the memory cell group 150 are pulled low.

For example, in FIG. 8 the wordlines 102a–102d form the wordline subset for the memory cell group 150. If wordline 102b is selected it is pulled low, while the nonselected wordlines 102a, 102c, and 102d are asserted high. Further, all other wordlines in the metal programmable cell array are pulled low, since they are not in the same wordline subset as the selected wordline 102b.

Preferably, only one wordline is selected at any one time. As a result, the memory cell group 150 shown in FIG. 8 allows the bitline 104 to remain high regardless of which wordline is selected. Specifically, all the wordlines 102a–102d of memory cell group 150 must be high in order for the bitline 104 to be pulled low. However, if one of the wordlines 102a–102d in the memory cell group 150 is selected it will be pulled low. Further, if none of the wordlines 102a–102d in the memory cell group 150 is selected all the wordlines 102a–102d in the memory cell group 150 will be pulled low.

Thus, the memory cell transistors 106a–106d described thus far have been shown in "1" cell format. Specifically, each memory cell transistor 106a–106d of the memory cell group 150 shown in FIG. 8 allows the bitline 104 to remain high when the corresponding wordline 102a–102d is selected. To add further functionality to a memory cell group, particular memory cells may be programmed to "0" cell format. As discussed previously, a "0" cell allows the bitline to be pulled low when the corresponding wordline is selected.

Figure 9:
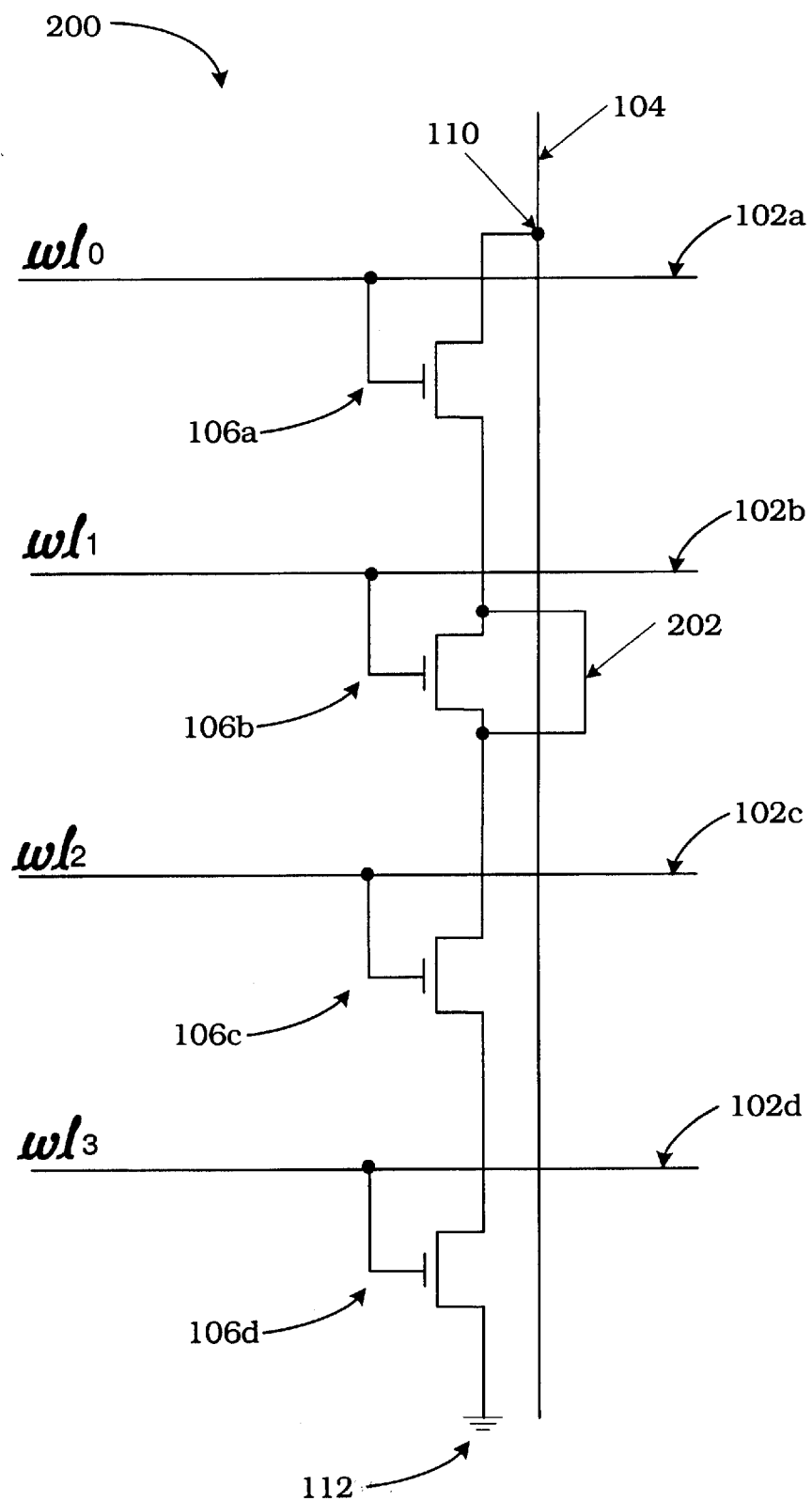
FIG. 9 is a schematic diagram showing an exemplary programmed memory cell group of a metal programmable ROM cell array having a programmed "0" cell, in accordance with an embodiment of the present invention.

FIG. 9 is a schematic diagram showing an exemplary programmed memory cell group 200 of a metal programmable ROM cell array having a programmed "0" cell, in accordance with an embodiment of the present invention. The programmed memory cell group 200 includes a bitline 104, and a plurality of wordlines 102a–102d, each coupled to a gate terminal of a memory cell transistor 106a–106d each having a gate, and first and second terminals. The programmed memory cell group 200 also includes a group virtual ground 112, and a transistor shorting component 202 coupling the first and second terminals of memory cell transistor 106b. As with FIG. 7, the wordlines 102a–102d and the bitline 104 occupy different levels of the semiconductor, and thus do not physically intersect.

As shown in FIG. 9, a first terminal of transistor 106a is coupled to the bitline 104 via bitline contact 110, the second terminal of transistor 106a is coupled to a first terminal of transistor 106b, and the gate of transistor 106a is coupled to wordline 102a. The second terminal of transistor 106b is coupled to a first terminal of transistor 106c, and the gate of transistor 106b is coupled to wordline 102b. Further, the second terminal of transistor 106c is coupled to a first terminal of transistor 106d, while the gate of transistor 106c is coupled to wordline 102c. Finally, the second terminal of transistor 106d is coupled to the group virtual ground 112, while the gate of transistor 106d is coupled to wordline 102d.

In the present invention, to program a memory cell to a "0" cell configuration the corresponding memory cell transistor is shorted. Specifically, a transistor shorting component 202 is coupled to both terminals of the memory cell transistor. In the exemplary programmed memory cell group 200 memory cell transistor 106b has been programmed to a "0" cell transistor by having a transistor shorting component 202 coupled to its first and second terminal, thus shorting memory cell transistor 106b. As programmed, memory cell transistor 106b will allow current to flow from its first terminal to its second terminal via the transistor shorting component 202, regardless of the state of the corresponding wordline 102b. Thus, when wordline 102b is low and consequently memory cell transistor 106b is off, current will still flow between the first and second terminals of memory cell transistor 106b via the shorting component 202.

Programming memory cell transistor 106b in "0" cell configuration causes the bitline 104 to be pulled low when wordline 102b is selected. Specifically, wordline 102b is pulled low when it is selected, and wordlines 102a, 102c, and 102d are all asserted high. Asserting wordlines 102a, 102c, and 102d high allows current to flow between the terminals of each transistor, as discussed above. Further, current flows between the terminals of memory cell transistor 106b regardless of the state of wordline 102b. As a result, when wordline 102b is selected current is allowed to flow from the bitline 104 to the bitline contact 110 and then through transistors 106a–106d to the group virtual ground 112. As stated previously, when a wordline coupled to a memory cell of the memory cell group is selected, the corresponding group virtual ground 112 is enabled. Otherwise, the group virtual ground 112 is disabled.

Figure 10:
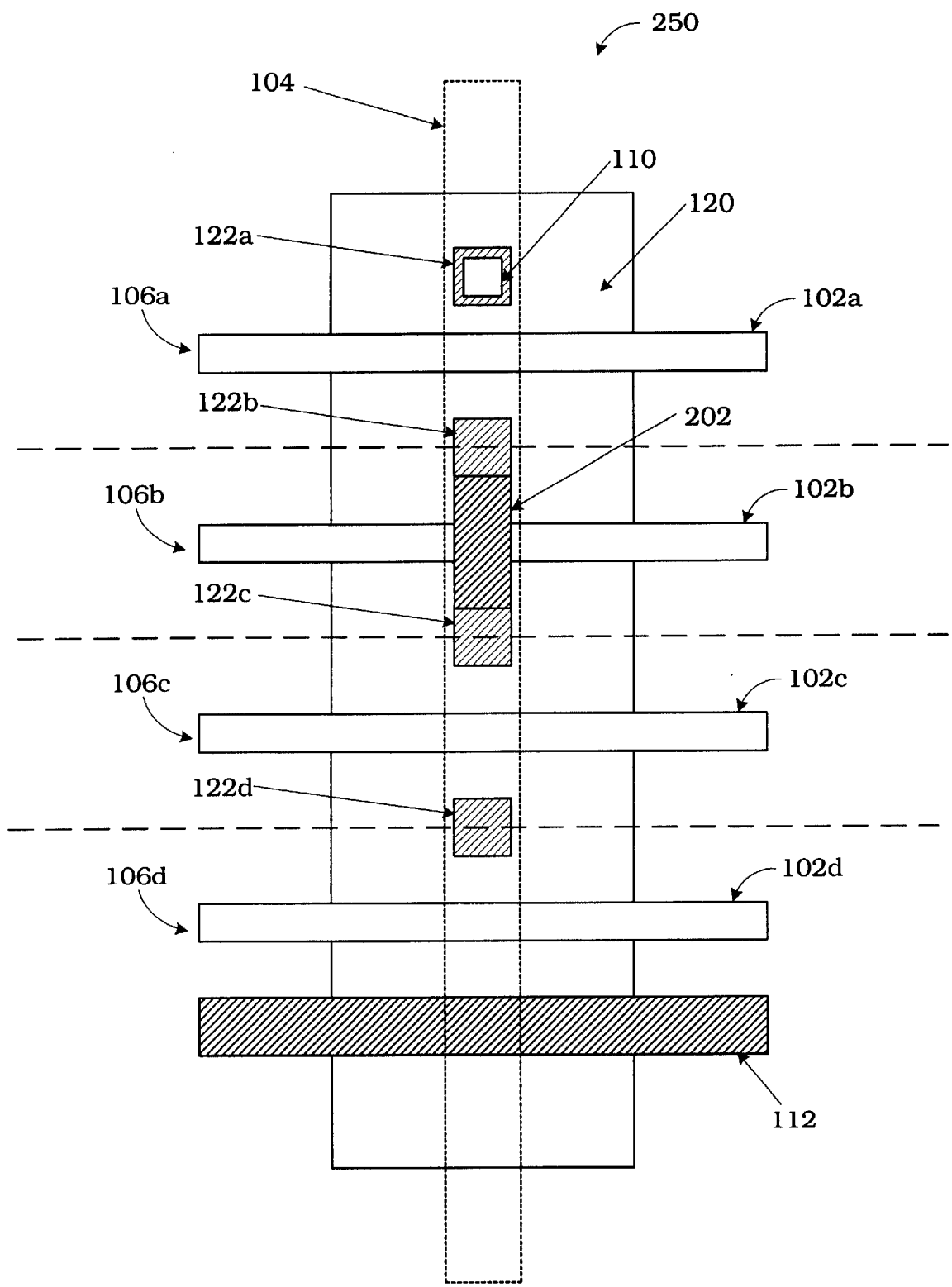
FIG. 10 is an illustration showing an exemplary programmed memory cell group of a metal programmable ROM cell array having a programmed "0" cell, in accordance with an embodiment of the present invention.

FIG. 10 is an illustration showing an exemplary programmed memory cell group 250 of a metal programmable ROM cell array having a programmed "0" cell, in accordance with an embodiment of the present invention. The memory cell group 250 includes a bitline 104, a plurality of polysilicon wordlines 102a–102d coupled to a diffusion layer 120 forming memory cell transistors 106a–106d, a plurality of metal pads 122a–122d also coupled to the diffusion layer.120, and a bitline contact 110 coupling the bitline 104 to the first metal pad 122a. Further, the memory cell group 150 includes a group virtual ground 112 coupled to the diffusion layer 120. In addition, a transistor shorting component 202 couples metal pad 122b to metal pad 122c, shorting memory cell transistor 106b.

As previously stated, the polysilicon wordlines 102a–102d, the metal pads 122a122d, and the bitline 104 are all formed on different levels of the substrate, and therefore do not physically interact except through vias having contacts, such as the bitline contact 110. Further, although only four memory cell transistors are shown in the memory cell group 250 of FIG. 10, any number of memory cell transistors may be included in a single memory cell group as desired by the ROM designer.

As stated previously, to program a "0" cell in the present invention, the corresponding memory cell transistor is shorted. In the memory cell group 250 of FIG. 10, memory cell transistor 106b is programmed to a "0" cell by shorting its terminals together. Specifically, metal pad 122b and metal pad 122c are coupled to the first and second terminals of memory cell transistor 106a by a contact via to the diffusion layer 120. Metal pads 122b and 122c are also coupled to each other using a transistor shorting component 202. Preferably the metal pads 122a–122d are formed on the same metal layer as the transistor shorting component 202. Therefore, the transistor shorting component 202 can be formed from the same conductive material as used to form the metal pads, or any other conductive material. If made from the same conductive material as used to form the metal pads 122a–122d, the transistor shorting component 202, metal pad 122b, and metal pad 122c can be formed as a single line of metal.

As programmed, memory cell transistor 106b will allow current to flow from its first terminal to its second terminal via the transistor shorting component 202 and metal pads 122b and 122c, regardless of the state of the corresponding wordline 102b. Thus, when wordline 102b is low and consequently memory cell transistor 106b is off, current will still flow between the first and second terminals of memory cell transistor 106b via the shorting component 202 and metal pads 122b and 122c.

Programming memory cell transistor 106b in "0" cell configuration causes the bitline 104 to be pulled low when wordline 102b is selected. Specifically, wordline 102b is pulled low when it is selected, and wordlines 102a, 102c, and 102d are all asserted high.

As discussed above, asserting wordlines 102a, 102c, and 102d high allows current to flow between the terminals of each transistor. Further, current flows between the terminals of memory cell transistor 106b regardless of the state of wordline 102b. As a result, when wordline 102b is selected, and thus pulled low, current is allowed to flow from the bitline 104 through the bitline contact 110 to the first metal pad 122a and then through transistors 106a–106d to the group virtual ground 112. As stated previously, when a wordline coupled to a memory cell of the memory cell group is selected, the corresponding group virtual ground 112 is enabled. Otherwise, the group virtual ground 112 is disabled.

Figure 11:
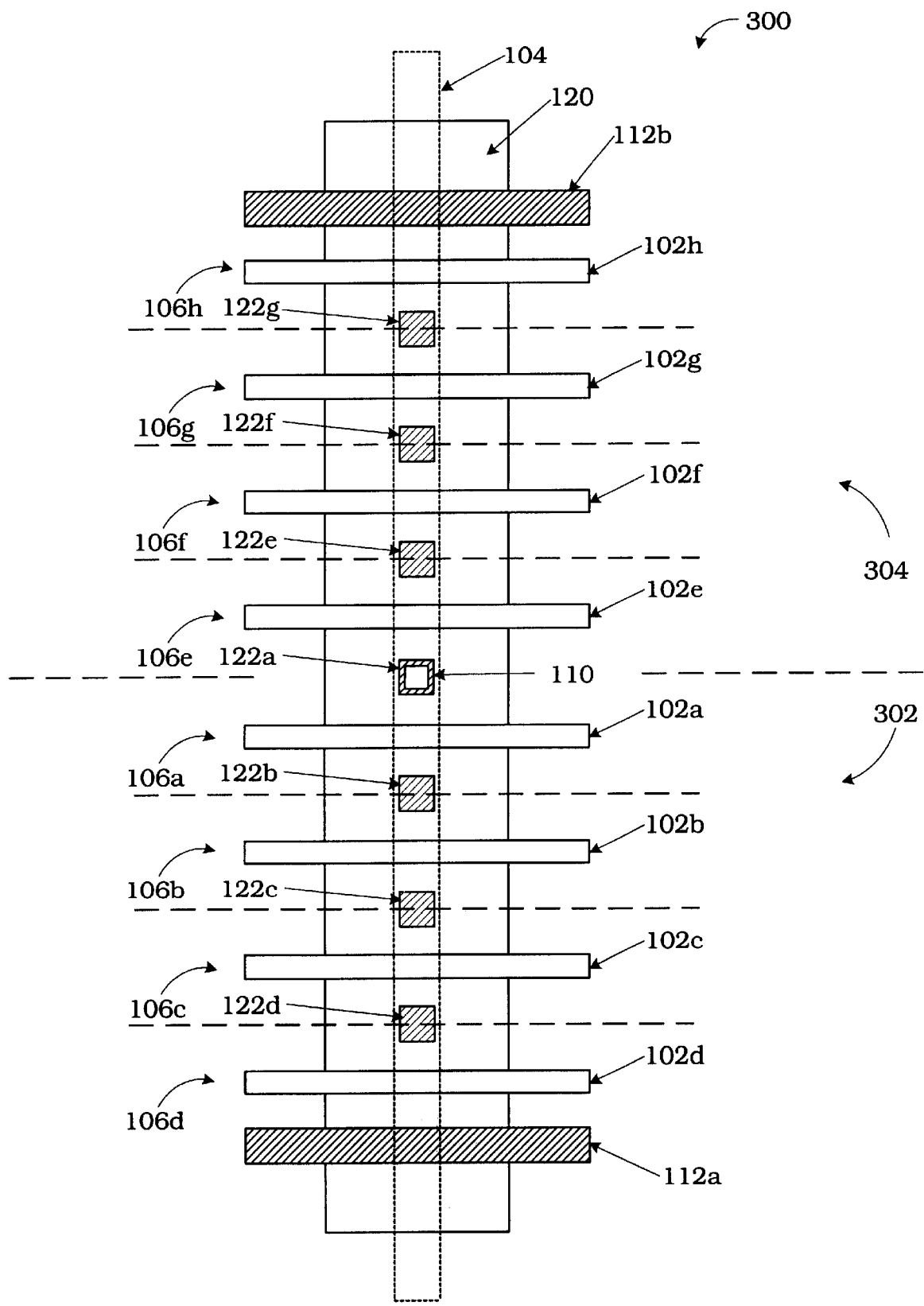
FIG. 11 shows a metal programmable ROM memory cell array having two memory cell groups, in accordance with an embodiment of the present invention.

FIG. 11 shows a metal programmable ROM memory cell array 300 having two memory cell groups, in accordance with an embodiment of the present invention. The metal programmable cell array 300 includes a bitline 104, a first memory cell group 302, and a second memory cell group 304. Both the first memory cell group 302 and the second memory cell group 304 are formed on a single diffusion layer portion 120.

The first memory cell group 302 includes a plurality of polysilicon wordlines 102a–102d coupled to the diffusion layer 120 forming memory cell transistors 106a–106d. In addition, the first memory cell group 302 includes a plurality of metal pads 122a–122d also coupled to the diffusion layer 120, and a shared bitline contact 110 coupling the bitline 104 to the first shared metal pad 122a. In addition, the memory cell group 302 includes a first group virtual ground 112a coupled to the diffusion layer 120.

Similarly, the second memory cell group 304 includes a plurality of polysilicon wordlines 102e–102h coupled to the diffusion layer 120 forming memory cell transistors 106e–106h. In addition, the second memory cell group 304 includes the first shared metal pad 122a and a plurality of metal pads 122e–122g coupled to the diffusion layer 120, and the shared bitline contact 110 coupling the bitline 104 to the first shared metal pad 122a. In addition, the second memory cell group 304 includes a second group virtual ground 112b coupled to the diffusion layer 120. It should be noted that each memory cell group can include any number of transistors. Thus, memory cell groups can be designed to include two, four, eight, or sixteen transistors, or any other number of transistors as desired by the ROM designer.

The metal programmable ROM memory cell array 300 operates as described previously with respect to FIGS. 7–10. In particular, wordlines 102a–102d form a first wordline subset associated with the first memory cell group 302, and wordlines 102e–102g form a second wordline subset associated with the second memory cell group 304. Selecting a wordline in the first wordline subset will enable the first group virtual ground 112a, while selecting a wordline in the second wordline subset will enable the second group virtual ground 112b. Enabling each group virtual ground 112a/112b only when its associated memory cell group 302/304 is active prevents the bitline 104 from being automatically pulled down by a neighboring memory cell group having all group cells programmed as "0" cells, shorting the bitline contact directly to ground. For example, if memory cell transistors 106a–106d are all programmed to "0" cells, the bitline 104 will always be shorted to the first group virtual ground 112a. Consequently, the bitline 104 will be pulled every time the first group virtual ground 112a is enabled, thus it is only enabled when one of wordlines 102a–102d are selected.

In this manner, the present invention allows memory cell groups to share bitline contacts, which greatly reduces the bitline load as compared to conventional ROMs. For example, the configuration of FIG. 11 allows eight memory cells to share the same bitline contact. As shown previously, a conventional diffusion programmable ROM only allows two transistors to share a bitline contact, and a conventional metal programmable ROM does not allow any bitline contact sharing.

Moreover, the metal programmable ROM of the present invention is generally denser than conventional programmable ROMs. Because of the limitations of other semiconductor manufacturing processes, there exist minimum size rules that restrict the size of a piece of diffusion used in semiconductor manufacturing to a predetermined minimum diffusion size. Thus, if a transistor can be designed on a particular size of diffusion, it will be restricted to a larger size of diffusion if the particular design size is smaller than the predetermined minimum diffusion size.

As discussed previously, each "1" cell in a conventional diffusion programmable ROM requires two separate portions of diffusion, each being no smaller than the predetermined minimum diffusion size. Similarly, all memory cells of a conventional metal programmable ROM are formed on separate portions of diffusion, each being no smaller than the predetermined minimum diffusion size.

In contrast, groups of memory cells of the present invention are formed on a single portion of diffusion, and more than one memory cell group may occupy a single portion of diffusion, as shown in FIG. 11. Thus, there are generally no concerns about minimum diffusion size in the present invention. As a result, both "1" cell and "0" cell memory transistors may be made small than is possible with conventional programmable ROMs. Consequently the metal programmable ROM of the present invention can be made smaller and denser than conventional programmable ROMs.

Figure 12:
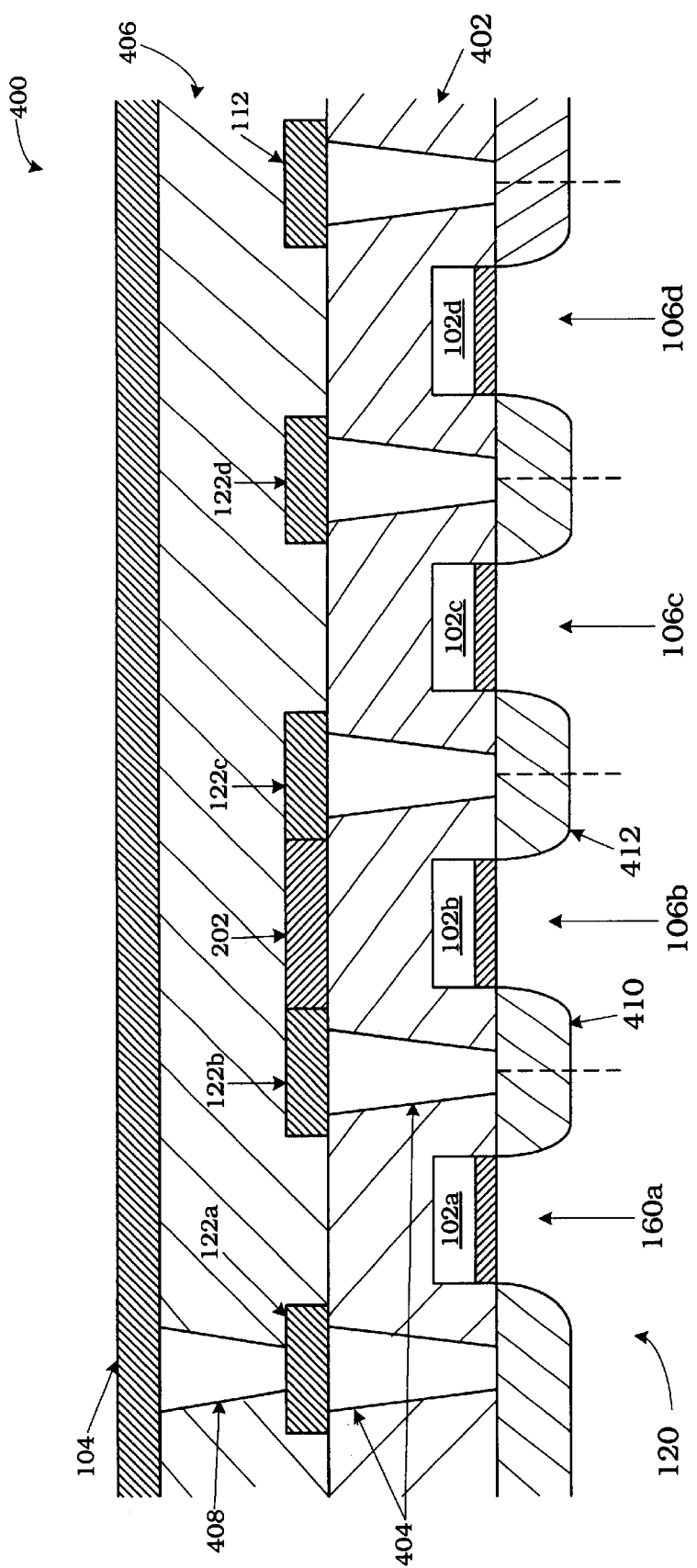
FIG. 12 is an illustration showing a side view of a memory cell group of metal programmable ROM, in accordance with an embodiment of the present invention.

FIG. 12 is an illustration showing a side view of a memory cell group 400 of a metal programmable ROM memory cell array, in accordance with an embodiment of the present invention. The memory cell group 400 includes a diffusion layer 120 and polysilicon wordlines 102a–102d formed on gate oxide to create transistor gates for memory cell transistors 106a–106d. A first dielectric layer 402 is formed over the memory cell transistors 106a–106d, and transistor contact vias 404 are formed in the first dielectric layer 402 to provide contacts to the transistor terminals. Metal pads 122a–122d are formed over the first dielectric layer 402 above the transistor contact vias 404. If a "0" cell is desired, a transistor shorting component 202 can be formed coupling the metal pads that are connected to terminals of the "0" cell memory transistor.

In addition, a group virtual ground 112 is formed over the first dielectric layer 402 above a transistor contact via 404. A second dielectric layer 406 is formed above the metal pads 122a–122d, the group virtual ground 112, and any transistor shorting components 202. A bitline contact 408 via is formed in the second dielectric layer 406 above the first metal pad 122a. Finally, a bitline 104 is formed above the second dielectric layer 406 coupled to the first metal pad through the bitline contact 408.

Each memory cell transistor 106a–106d includes a first terminal 410 and a second terminal 412. As shown in FIG. 12, the memory cell transistors 106a–106d are coupled together via their terminals. In addition, the first terminal of memory cell transistor 106a is coupled to the bitline 104 through a contact via 404, the first metal pad 122a, and bitline contact 408. Finally, the second terminal of memory cell transistor 106d is coupled to the group virtual ground 112 through a contact via 404.

As previously stated, a "0" cell is programmed by shorting the terminals of the memory cell transistor of the "0" cell. For example, in FIG. 12 memory cell transistor 106b is programmed as a "0" cell. In particular, the first 410 and second 412 terminals of memory cell transistor 106b are coupled to metal pads 122b and 122c through contact vias 404. The transistor shorting component 202 couples metal pad 122b to metal pad 122c, thus coupling the first 410 and second 412 terminals of memory cell transistor 106b together. Hence, current will flow from the first terminal 410 to the second terminal 412 of memory cell transistor 106b regardless of the state of the associated wordline. 102b. In all other cases, current will flow from the first terminal to the second terminal of a memory cell transistor 106a, 106c, and 106d only when its gate terminal, which is its associated wordline 102a/102c/102d, is high.

Figure 13:
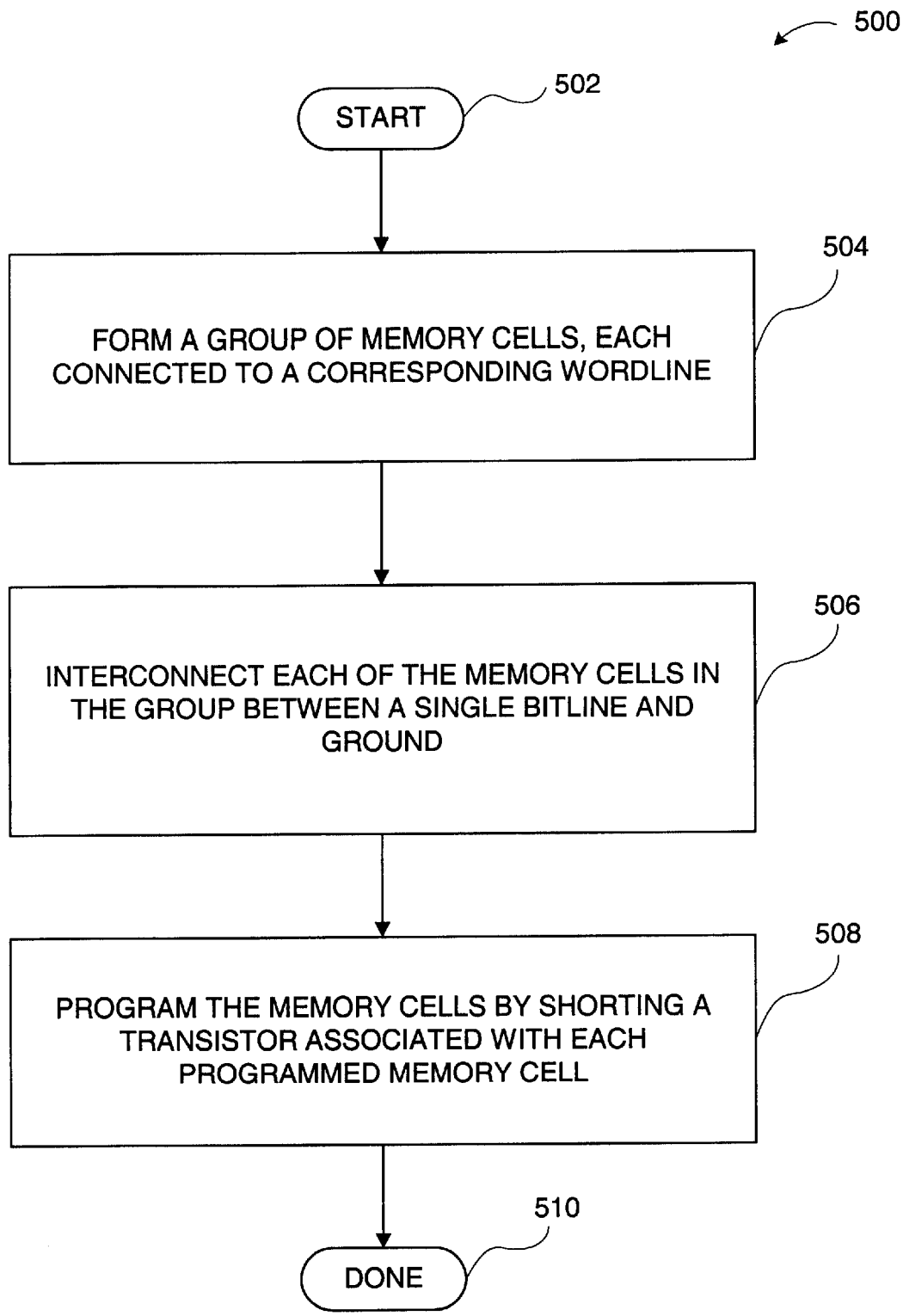
FIG. 13 is a flowchart showing a method for manufacturing a metal programmable ROM, in accordance with an embodiment of the present invention.

FIG. 13 is a flowchart showing a method 500 for manufacturing a metal programmable ROM, in accordance with an embodiment of the present invention. In an initial operation 502, preprocess operations are performed. Preprocess operations include micro-code design, determining the number of memory cells per memory cell group and other preprocess operations that will be apparent to those skilled in the art.

In a memory cell forming operation 504, a group of memory cells are formed, wherein each memory cell of the group is connected to a corresponding wordline. After determining the number of memory cells per memory cell group, a memory cell transistor is formed for each memory cell using a polysilicon wordline and gate oxide. The wordlines for the memory cell array form the actual gates of the memory cell transistors, with the diffusion layer forming the memory cell transistor terminals. Preferably, the memory cell transistors are coupled together in series.

Next, the memory cells are interconnected between a single bitline and the ground, in operation 506. After the memory cell transistors are formed, a dielectric layer is formed over the memory cell transistors and contact vias are formed over the memory cell transistor terminals. Metal pads are then formed above contact vias in the dielectric layer, along with any transistor shorting components, discussed in greater detail next. Another dielectric layer is then formed over the metal pads, and a bitline contact via is formed in the second dielectric layer above a first metal pad.

A bitline is then formed above the second dielectric layer, coupled to the first memory cell transistor through the bitline contact, first metal pad, and the contact via in the first dielectric layer. In addition, a group virtual ground is formed over the contact via above the second terminal of the last memory cell transistor in the memory cell group. In this manner, the memory cells are interconnected between a single bitline and ground.

In a programming operation 508, the memory cells are programmed by shorting a transistor associated with each programmed memory cell. Since all memory cells theoretically are initially configured in a "1" cell format, programming a memory cell generally refers to configuring the memory cell to a "0" cell format. However, in some embodiments, programming can refer to configuring a memory cell into a "1" cell format.

To program a memory cell to a "0" cell, the terminals of the memory cell transistor are shorted together. Typically, this is accomplished by coupling together the metal pads 122a–122d that are coupled to the terminals of the "0" cell memory transistor with a transistor shorting component. If the transistor shorting component is formed of the same material as the metal pads, this can be accomplished by simply forming a single metal line coupling the contact vias above the terminals of the "0" cell memory transistor.

For example, in referring to FIG. 12, memory cell transistor 106b is configured as a "0" cell transistor. In one embodiment, metal pad 122b, metal pad 122c, and the transistor shortening component 202 are formed as a single line of metal formed across the contact vias 404 above the first 410 and second 412 terminals of memory cell transistor 106b.

Referring back to FIG. 13, post process operations are performed in operation 510. Post process operations include forming and programming other memory cell groups in the metal programmable ROM memory cell array, and other post process operations that will be apparent to those skilled in the art. Advantageously, the metal programmable ROM of the present invention is programmed at the metal layer, rather than the diffusion level. As a result, the present invention provides increased flexibility because metal programmable ROM wafers may be held at the metal level, allowing for quick production of parts after a design change was received.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A metal programmable ROM, comprising:
   a memory cell array having a depth that is defined by a plurality of wordlines and a width that is defined by a plurality of bitlines;
   a group of memory cells coupled between a bitline and ground, each memory cell in the group of memory cells being coupled to at least one other memory cell in the group of memory cells; and
   a programmed memory cell defined by a memory cell transistor having a first terminal and second terminal shorted together.

2. A metal programmable ROM as recited in claim 1, wherein each memory cell is coupled to a corresponding wordline in the plurality of wordlines.

3. A metal programmable ROM as recited in claim 2, wherein each memory cell includes a transistor having a first terminal, a second terminal, and gate coupled to a wordline corresponding to the memory cell.

4. A metal programmable ROM as recited in claim 3, wherein a first memory cell of the group of memory cells includes a first transistor having a first terminal and a second terminal, wherein the first terminal is coupled to the bitline.

5. A metal programmable ROM as recited in claim 4, further comprising:
   a second memory cell of the group of memory cells, the second memory cell including a second transistor having a first terminal and a second terminal, wherein the first terminal is coupled to the second terminal of the first transistor;
   a third memory cell of the group of memory cells, the third memory cell including a third transistor having a first terminal and a second terminal, wherein the first terminal is coupled to the second terminal of the second transistor; and
   a forth memory cell of the group of memory cells, the fourth memory cell including a fourth transistor having a first terminal coupled to the second terminal of the third transistor, and a second terminal coupled to ground.

6. A metal programmable ROM as recited in claim 1, wherein the programmed memory cell is a "0" cell.

7. A metal programmable ROM as recited in claim 6, wherein a selected wordline coupled to a memory cell in the group of memory cells is pulled low, and wherein all other wordlines coupled to memory cells in the group of memory cells are asserted high.

* * * * *